US006778420B2

(12) United States Patent
Parkinson (10) Patent No.: US 6,778,420 B2
(45) Date of Patent: Aug. 17, 2004

(54) METHOD OF OPERATING PROGRAMMABLE RESISTANT ELEMENT (75) Inventor: Ward Parkinson, Boise, ID (US)

(73) Assignee: Ovonyx, Inc., Boise, ID (US)

( * ) Notice: Subject to any disclaimer, the term of this patent is extended or adjusted under 35 U.S.C. 154(b) by 98 days.

(21) Appl. No.: 10/254,489

(22) Filed: Sep. 25, 2002

(65) Prior Publication Data
US 2004/0057271 A1 Mar. 25, 2004

(51) Int. Cl.[7] .............................................. G11C 17/00
(52) U.S. Cl. ...................................... 365/100; 365/148
(58) Field of Search ............................... 365/100, 148, 365/96, 105, 115, 163

(56) References Cited

U.S. PATENT DOCUMENTS

| 6,590,807 B2 | 7/2003 | Lowrey ...................... 365/175 |
| 6,597,598 B1 | 7/2003 | Tran et al. .................... 365/94 |
| 6,608,773 B2 | 8/2003 | Lowrey et al. ............. 365/100 |
| 2003/0174530 A1 | 9/2003 | Tran ........................... 365/100 |
| 2003/0206428 A1 | 11/2003 | Parkinson ................... 365/100 |

Primary Examiner—Anh Phung
(74) Attorney, Agent, or Firm—Philip H. Schlazer; Marvin S. Siskind

(57) ABSTRACT

A method of programming a programmable resistance element. The programmable resistance element may be programmed to a BLOWN state. After being programmed to the BLOWN state, the element can no longer be programmed to its low resistance state. The method of programming allows the programmable resistance element to be used as a fuse.

28 Claims, 6 Drawing Sheets

METHOD OF OPERATING PROGRAMMABLE RESISTANT ELEMENT

FIELD OF THE INVENTION

The present invention relates generally to programmable resistance memory elements. More specifically, the present invention is related to a method of programming a programmable resistance element.

BACKGROUND AND PRIOR ART

Laser blown fusable links have many applications in integrated circuit technology. For example, laser blown fuses may be used in memory arrays to repair bad memory cells with redundant memory cells. If some of the memory cells in a semiconductor memory device are found defective in a testing operation, the defective memory cells are identified and replaced with reserve memory cells in the redundant circuits as necessary. In this manner, the defect of the semiconductor memory device is repaired. To activate the reserve memory cells in the redundant circuits (i.e., to use the redundant memory cells), after the defective memory cells are identified, they need to be electrically disconnected from the memory cell array and furthermore, the redundant or reserve memory cells need to be electrically connected to the same array instead. Such switching or replacement of electrical connection are typically realized by disconnecting specific wiring lines by opening "repair fuses" provided beforehand in the device as necessary.

In addition to repairing bad memory cells, laser blown fuses may also be used for the customization of an integrated circuit to give it special characteristics. For example, fuses may be used to program non custom programmable devices. Fuses may also be used for identification purposes such as to store information about an integrated circuit or mark an integrated circuit in a manner that is readable visually or electrically, for example serialization of the integrated circuit, or how the device is configured by the laser. Laser blown fuses are typically opened by being irradiated by a laser beam during a process called "laser trimming".

Laser blown fuses have several inherent disadvantages. These include high capital cost, floor space, and manufacturing time required for the tools and process used to laser blow the links. Also laser blown fuses must be blown (i.e., opened) prior to final product packaging. This rules out die customizing at later steps in the manufacturing process or in the field by the customer. Laser fuses take up significant die area, limiting the number of fuses that can practically be used.

Programmable resistance memory elements formed from programmable resistance materials that can be programmed between at least two electrical resistivities in response to electrical signals are known in the art. Such programmable resistance elements may be programmed to a high resistance state to store, for example, a logic ZERO data bit. As well, they may be programmed to a low resistance state to store, for example, a logic ONE data bit.

One type of material that can be used as the programmable resistance memory material for programmable resistance elements is a phase change material. Phase change materials may be programmed between a first structural state where the material is generally less ordered (for example, an amorphous state) and a second structural state where the material is generally more ordered (for example, a crystalline state). The less ordered structural state exhibits a higher electrical resistivity than the more ordered structural state.

Phase change materials may also be programmed in incremental steps reflecting (1) changes of local order, or (2) changes in the relative volume of materials having different local order so as to provide a "gray scale" represented by a multiplicity of conditions of local order. The use of electrically programmable phase-change materials is disclosed, for example in U.S. Pat. No. 5,116,758, the disclosure of which is incorporated by reference herein. Other examples of phase-change materials and memory elements are provided in U.S. Pat. Nos. 5,296,716, 5,414,271, 5,359,205, 5,341,328, 5,536,947, 5,534,712, 5,687,112, and 5,825,046, the disclosures of which are all incorporated by reference herein.

The present invention is directed to a method of operating a programmable resistance memory element so that the programmable resistance memory element may be operated as a fuse. Hence, a fuse is achieved through programming of a programmable resistance memory element rather than through the special requirement of a laser or special thin film.

SUMMARY OF THE INVENTION

One aspect of the present invention is a method of operating a programmable resistance element having at least a low resistance state and a high resistance state, the method comprising the steps of: providing the programmable resistance element, the element including a programmable resistance material; and applying energy to the programmable resistance material sufficient to transform the programmable resistance element to a condition wherein application of additional energy is unable to transform the programmable resistance element to the low resistance state.

Another aspect of the present invention is a method of customizing an integrated circuit, the integrated circuit including a first circuit coupled to a second circuit through a programmable resistance element having at least a low resistance state and a high resistance state, the element including a programmable resistance material, the method including the step of: applying energy to the programmable resistance material sufficient to transform the programmable resistance element to a condition wherein application of additional energy is unable to transform the programmable resistance element to the low resistance state.

Another aspect of the invention is an electrically programmable memory array, comprising: a plurality of programmable resistance elements having at least a low resistance state and a high resistance state, at least one of the elements being in a condition such that applying energy to the element in the condition is unable to transform the element in the condition to the low resistance state.

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

The present invention is directed to programmable resistance memory elements. The memory element comprises a volume of programmable resistance memory material. The programmable resistance material may be programmed between at least two resistance states in response to electrical signals. The memory element further comprises a means of delivering the electrical signals to the volume of memory material. The means of delivering the electrical signals may be in the form of one or more electrodes. An electrode may include an emitter tip electrode which emits an electron beam into the programmable resistance material. The emitter tip electrode may be spacedly disposed from the programmable resistance material. Preferably, the means of delivering the electrical signals comprises a first and a second electrode which are in electrical communication with the volume of memory material. Electrodes may also be referred to as electrical contacts.

Figure 1:
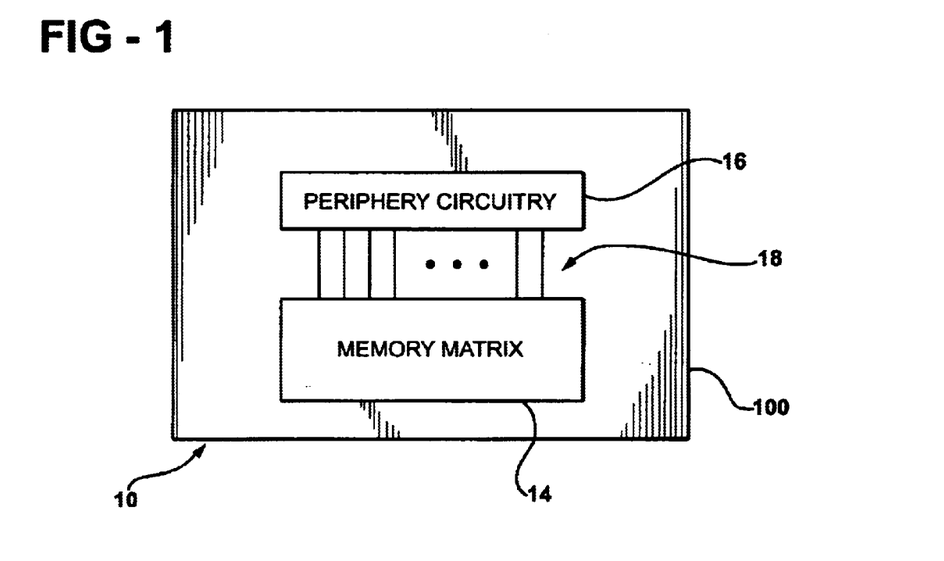
FIG. 1 shows a high-level diagram of a memory device including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
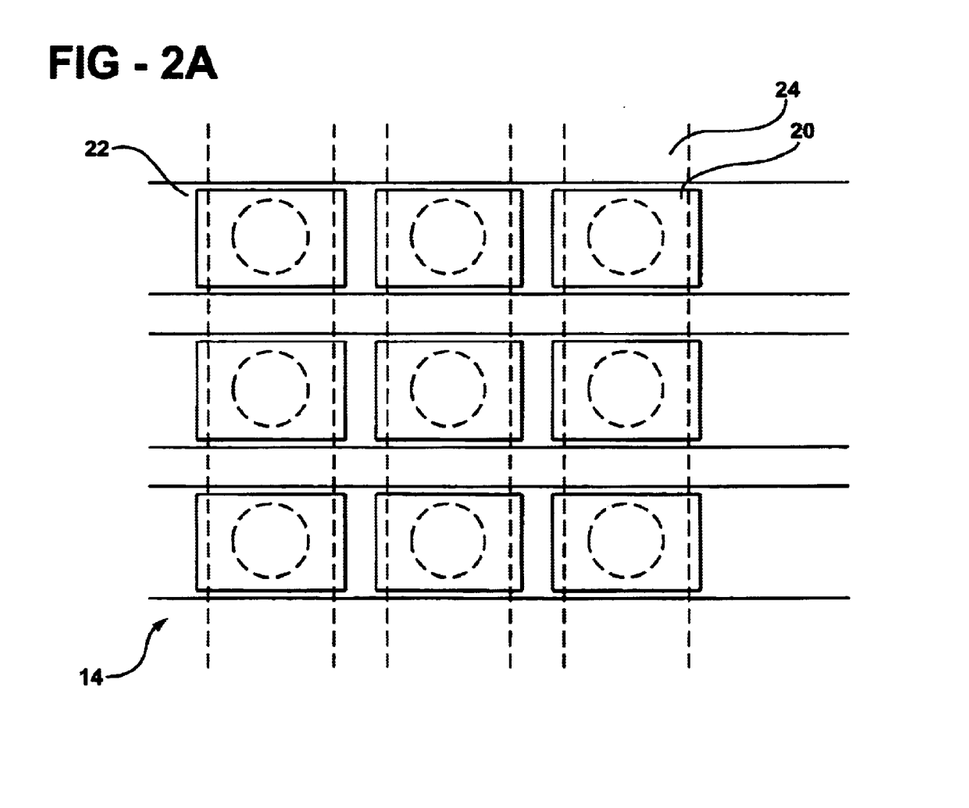
FIG. 2A shows a high-level diagram of a memory array.

A top view of the memory array 14 is shown in FIG. 2A. As can be seen, the memory array includes a plurality of memory cells 20 that are arranged in generally perpendicular rows and columns. As can be seen, the memory array 14 includes a plurality of memory cells 20 that are arranged in generally perpendicular rows and columns. The memory cells 20 in each row are coupled together by a respective wordline 22, and the memory cells 20 in each column are coupled together by a respective bitline 24.

Figure 2B:
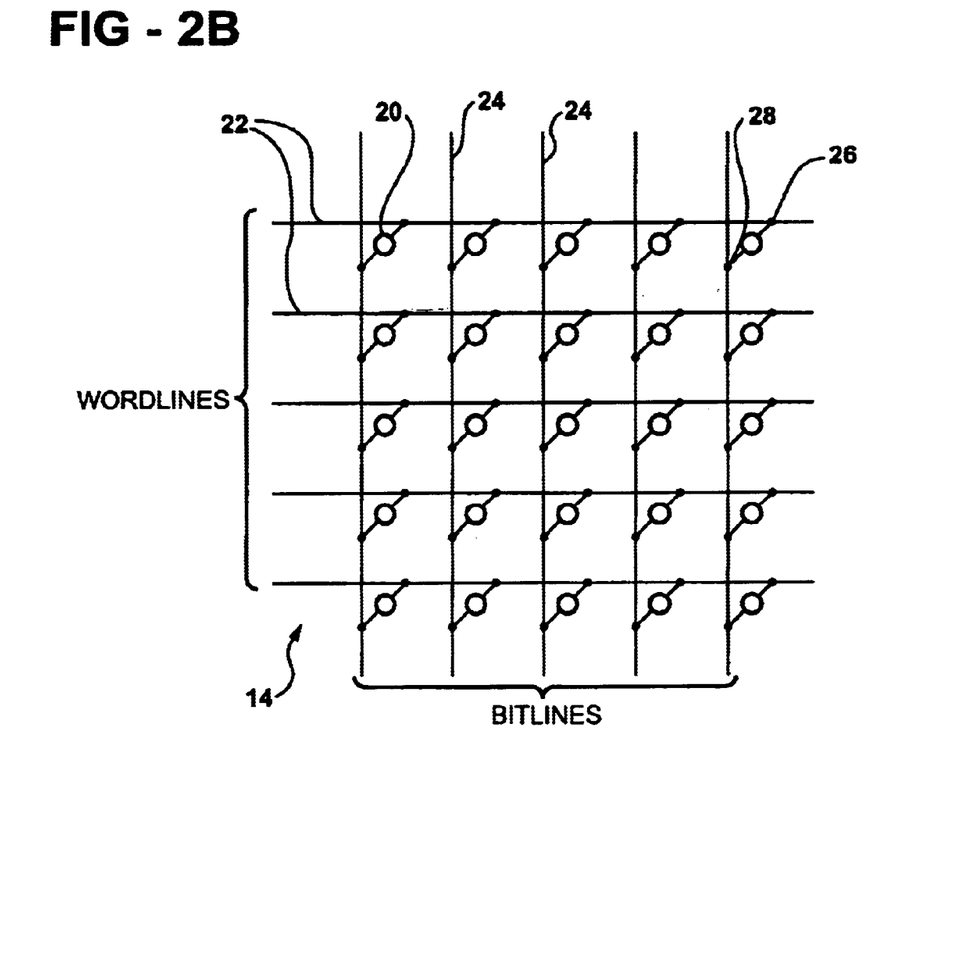
FIG. 2B is a schematic diagram of a memory array.

A schematic diagram of the memory array 14 is shown in FIG. 2B. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
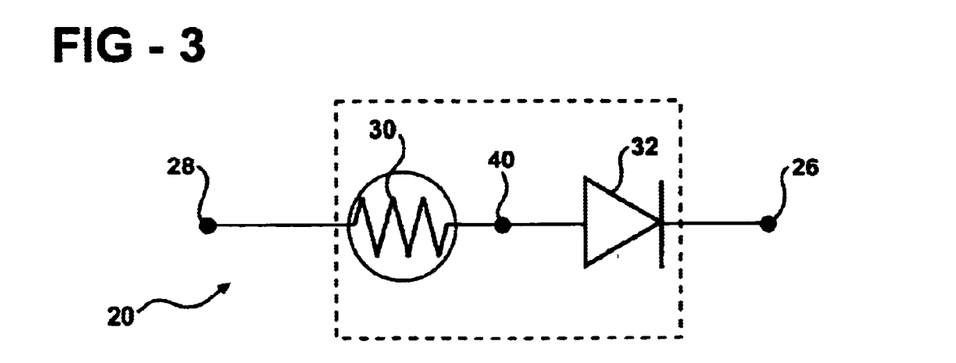
FIG. 3 is a schematic diagram of a memory cell incorporating a programmable resistance element.
Figure 4:
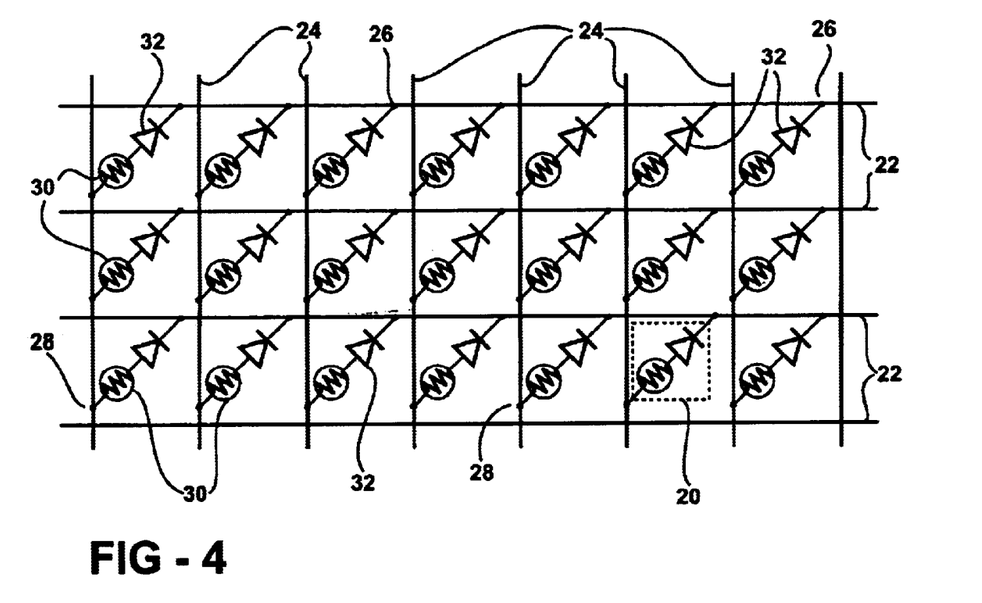
FIG. 4 shows an array of memory cells where each cell incorporate a programmable resistance element.

FIG. 3 illustrates an exemplary memory cell 20 that may be used in the memory array 14. The memory cell 20 includes a programmable resistance memory element 30 which is coupled to an access device 32. The access device electrically isolates each programmable resistance element from all other programmable resistance elements in the array. In the embodiment shown, the access device is a diode. However, other types of access devices, such as MOS and bipolar transistors may also be used instead of diodes. The programmable resistive element 30 may be made of a chalcogenide material, as will be more fully explained below. As illustrated in FIG. 3, the programmable resistance element 30 is coupled to a bitline 24 at the bitline node 28, and the access device 32 is coupled to a wordline 22 at the wordline node 26. However, it should be understood that connections of the programmable resistance element 30 may be reversed without adversely affecting the operation of the memory array 14. A memory array comprising the programmable resistance elements 30 and selection devices 32 is shown in FIG. 4.

Figure 5A:
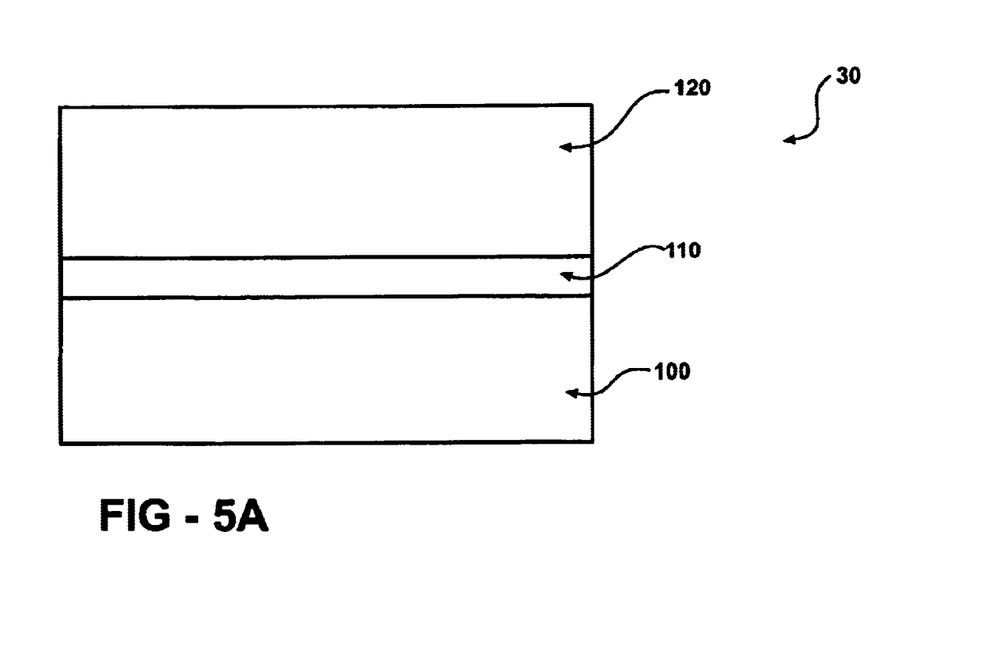
FIGS. 5A–5C show a process for making a programmable resistance element.
Figure 5B:
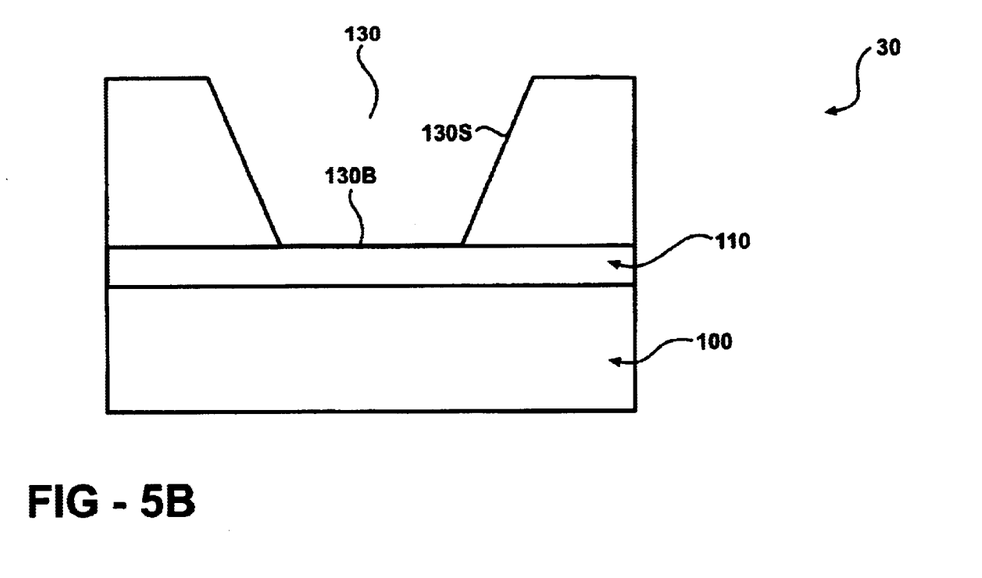
Figure 5C:
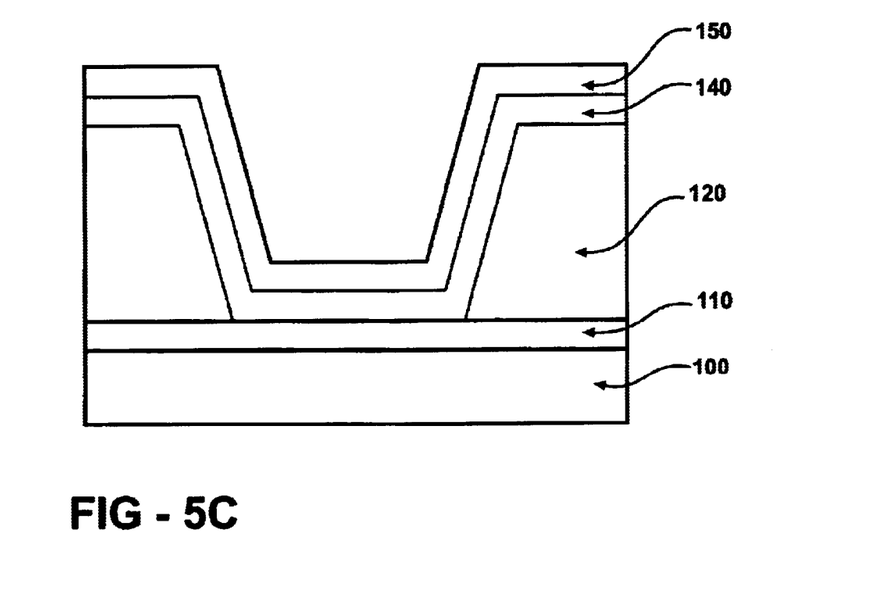

A structure of an exemplary memory cell 20 is illustrated in FIG. 5C, while a method for fabricating the memory cell 20 is described with reference to FIGS. 5A–5C. It should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of imbedded field oxide regions between each memory cell.

Referring first to FIG. 5A, a semiconductor substrate 100 is provided. The substrate 100 may include the access devices as well as the bitlines and/or wordlines. A layer of conductive material 110 is formed on top of the substrate 100. The conductive material 110 forms a bottom electrode for the memory device. A layer of dielectric material 120 is formed on top of the bottom electrode 110. The layer 110 may be comprised of any suitable dielectric material, such as silicon nitride or silicon dioxide. The dielectric layer 110 may be formed in any suitable manner, such as by chemical vapor deposition (CVD). Referring to FIG. 5B, an opening 130 is formed in the layer of dielectric 120. The opening 130 may be a hole or a trench. Preferably, the opening 130 is a hole through the dielectric that exposes the bottom electrode 110. Referring to FIG. 5C a programmable resistance material 140 such as a phase change material is deposited into the opening and a second conductive layer 150 is deposited on top of the programmable resistance material 140. The conductive layer 150 forms a second electrode for the memory device. In this example the second electrode 150 is a top electrode. The layer 110 may be comprised of any suitable dielectric material, such as silicon nitride or silicon dioxide. The dielectric layer 110 may be formed in any suitable manner, such as by chemical vapor deposition (CVD). The dielectric layer 110 has a top surface 110T.

It is noted that the device structure for the programmable resistance element is not limited to the device structure shown in FIG. 5C (which serves only as an example). Many other device structures are possible. Examples of other memory element structures are provided in U.S. Pat. Nos. 5,341,328, 5,406,509, 5,534,711, 5,536,947, 5,687,112, 5,933,365, the disclosures of which are all hereby incorporated by reference herein. Other examples are also provided in U.S. patent application Ser. Nos. 09/276,273, 09/620,318, 09/677,957 and 09/891,157, the disclosures of which are all hereby incorporated by reference herein. An example of circuitry for reading the state of a programmable resistance memory element is provided in U.S. Pat. No. 6,314,014, the disclosure of which is hereby incorporated by reference herein.

The programmable resistance element 30 comprises a programmable resistance material. The programmable resistance material is programmable between at least a high and a low electrical resistance value (where the high resistance value is higher than the low resistance value).

The programmable resistance element may be programmed between its high and low resistance states by applying energy to the programmable resistance material. For example, the programmable resistance element may be programmed from its high resistance state to its low resistance state by applying a pulse of energy to the memory material referred to as a "set" pulse. While not wishing to be bound by theory, it is believed that the set pulse modifies at least a portion of the memory material from a less ordered (and more resistive) state to a more ordered (and less resistive) state. A programmable resistance element programmed to its low resistance state is in the "SET" state.

The programmable resistance element may also be programmed from its low resistance state to its high resistance state by applying a pulse of energy to the memory material referred to as a "reset" pulse. While not wishing to be bound by theory, it is believed that the reset pulse modifies at least a portion of the memory material from a more ordered (and less resistive) state to a less ordered (and more resistive) state. An example of a reset pulse is an electrical current pulse having an amplitude as high as about 1.0 mA to about 3.0 mA or possibly higher. Preferably, the pulse width may be about 20 nsec to about 50 nsec. A programmable resistance element programmed to its high resistance state is in the "RESET" state.

In one embodiment, it is possible that a reset pulse and a set pulse may have about the same amplitude of current and about the same pulse width. They may be distinguished from each other by the terminating edge rate of the pulse. For example, the reset pulse trailing edge may be less than about 2 nsec and the set pulse trailing edge may be greater than about 250 nsec.

Hence, the programmable resistance element may be programmed back and forth between its low resistance state and its high resistance state. It has been discovered that applying a sufficient energy to the programmable resistance material will cause the programmable resistance element to be transformed to what is referred to herein as the BLOWN state. When the programmable resistance element is programmed to the BLOWN state, the programmable resistance element is placed into a condition such that the programmable resistance element can no longer be programmed to its low resistance state. Hence, when a programmable resistance element is in the BLOWN state, the application of additional energy will not be able to place the programmable resistance element into its low resistance state. After the programmable resistance element has been programmed to the BLOWN state, it will preferably remain in the BLOWN state regardless of the additional energy applied to the programmable resistance material. It is noted that a programmable resistance element programmed into the BLOWN state is said to have been "blown open".

While not wishing to be bound by theory, it is possible that the programmable resistance element may be transformed to the BLOWN state by appropriately modifying at least a portion of the programmable resistance material. The application of sufficient energy may modify the programmable resistance material so that the programmable resistance element can no longer be transformed to its low resistance state. Modification of programmable resistance material may include vaporization or otherwise destruction of the material.

Also, while not wishing to be bound by theory, it is possible that the programmable resistance element may be programmed to the BLOWN state by causing a delamination between the programmable resistance material and an electrode that is electrical contact with the programmable resistance material. It is possible that such delamination may also prevent the programmable resistance element from being programmed (or otherwise transformed) to its low resistance state.

The resistance of the programmable resistance element in the BLOWN state is preferably greater than the resistance of the programmable resistance element in the low resistance state. The resistance of the BLOWN state is preferably at least two times the resistance of the low resistance state. The resistance of the BLOWN state is more preferably at least three times the resistance of the low resistance state. The resistance of the BLOWN state is most preferably at least five times the resistance of the low resistance state. The resistance of the BLOWN state may even be at least ten times the resistance of the low resistance state. Having a resistance of at least two times the resistance of the low resistance state assures that the BLOWN state will be distinguishable from the low resistance state when the programmable resistance element is read.

In one embodiment of the invention, placing a programmable resistance element into the BLOWN state may create an electrically open circuit between two spacedly disposed electrodes that are in electrical contact with the programmable resistance material. In the example shown in FIG. 5C, an electrically open circuit may be formed between the bottom electrode 110 and the top electrode 160. While not wishing to be bound by theory, it is believed that the electrically open circuit may be caused by a modification of the programmable resistance material (such as a vaporization or a destruction of at least a portion of the programmable resistance material) between the two electrodes. (A vaporization or destruction of a portion of the material may create a gap or opening between the two electrodes, thereby creating an open circuit). Alternately, introduction of a sufficient energy may cause the programmable resistance material to separate from one or both of the electrodes and also creating a gap between the electrodes. Application of a sufficient energy to the programmable resistance material may create an electrically open circuit between the bottom and top electrodes so that substantially no electric current can flow between the electrodes.

Figure 6A:
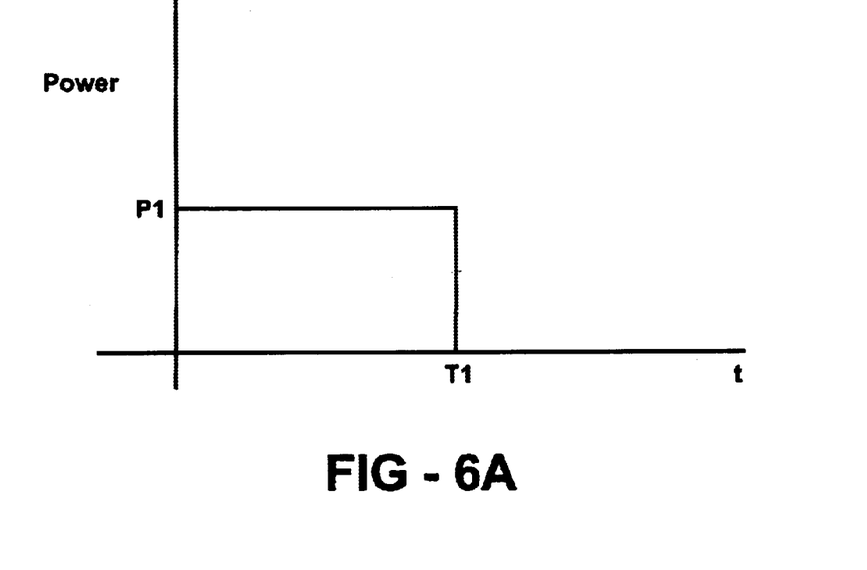
FIGS. 6A–6B show examples of energy pulses.
Figure 6B:
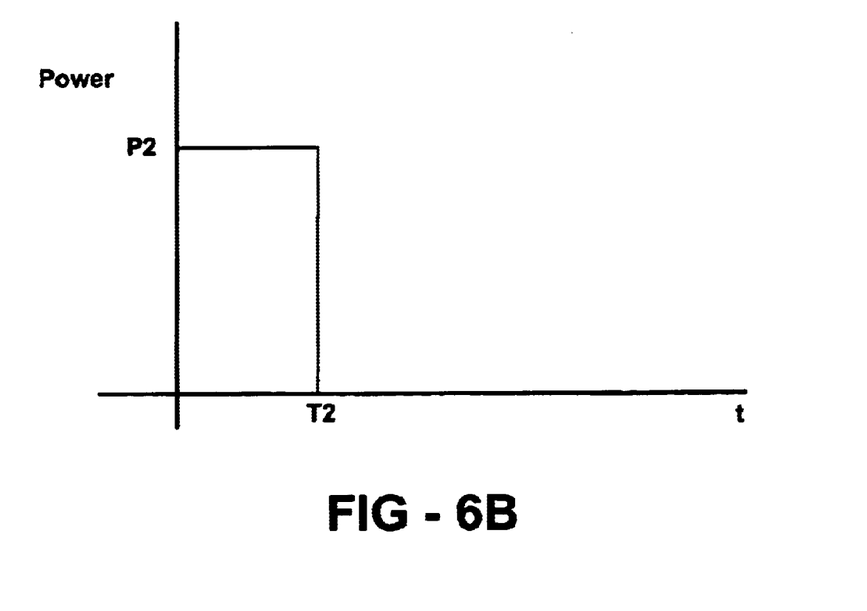

In order to place the programmable resistance element into the BLOWN state, energy must be applied to the programmable resistance material. The energy applied to the programmable resistance material may be in the form of a single pulse of energy or in the form of a plurality of discrete energy pulses. Examples of energy pulses are shown in FIGS. 6A and 6B. In 6A the energy pulse has an amplitude P1 and a time duration T1. The amplitude of the energy pulse is the rate at which the energy is applied. The rate at which the energy is applied is also referred to as the power of the energy pulse. The total energy delivered to the memory material is the power P1 of the energy pulse multiplied by the time T1 (that is, E1=P1×T1). In 6B the energy pulse is applied at a power P2 for a time period T2. Hence, the energy pulse shown in FIG. 6B delivers the energy at a higher rate (e.g., a high power) but for a shorter period of time. The rate at which the energy is applied (e.g., the power), the length of time at which the energy is applied as well as the total amount of energy that is applied may all be important factors in programming the programmable resistance element to the BLOWN state. In particular, it is believed that to place the programmable resistance element into the BLOWN state it is preferable that energy be applied to the programmable resistance material at a sufficiently high rate (for example, the energy is applied at a sufficiently high power). While, not wishing to be bound by theory, it is believed that the energy may preferably be applied at a rate which is sufficiently high to vaporize or otherwise destroy at least a portion of the programmable resistance material and as well as to compensate for energy losses to the external environment.

The energy for programming the programmable resistance element into the BLOWN state is preferably greater than the energy needed to program the programmable resistance element from its low resistance state to its high resistance state. The actual ratio of the amount of energy to blow open the device versus the amount of energy to reset the device may vary depending the actual structure and composition of the device (for example, it may depend upon the size of the area of contact between the electrodes and the memory material, the thickness of the memory material or the composition of the memory material). In one embodiment of the invention, the energy necessary for programming the memory element to the BLOWN state is at least five (5) times the amount of energy needed to program the device from its low resistance state to its high resistance. Preferably, the amplitude (e.g., the power) of the energy signal applied to the memory material for programming the memory element to the BLOWN state is at least five times the amplitude (e.g., the power) of the reset pulse. Preferably, the period or duration of the energy signal applied to the memory material for programming the memory element to the BLOWN state is at least two times the period or duration of the reset pulse. More preferably, the period or duration of the energy signal applied to the memory material for programming the, memory element to the BLOWN state is at least five times the period or duration of the reset pulse.

The energy applied to the programmable resistance material may be in any form (for example, electrical, thermal, optical or mechanical). The energy applied to the programmable resistance material is preferably in the form of electrical energy. That is, it is in the form of an electrical signal. The electrical signal may be in the form of a controlled electrical current (such as by a current source), in the form of a controlled electrical voltage (such as by a voltage source) or in the form of an electron beam. The electrical signal is preferably in the form of one or more current pulses. More preferably, the electrical signal is in the form of a single current pulse.

When electrical current is used to program the programmable resistance element to the BLOWN state, the amplitude of the current used to program the programmable resistance element into the BLOWN state is preferably at least 5 times the amplitude of the current needed to reset the device from its low resistance state to its high resistance state. For example, in one embodiment of the invention it is possible that a programmable resistance element will reset to its high resistance state using a current pulse with an amplitude of about 1 mA. This current pulse may have a duration of about 20 nsec. In this case, the amplitude of the current pulse used to program the device into the BLOWN state may be at least 5 mA (and may have a duration of about 100 nsec or greater). To provide additional margin between resetting a programmable resistance element and blowing it open, a current having an amplitude of at least 8 times (or even 10 times) the current needed to reset the device may be used to blow the device open. When electrical current is used to program the programmable resistance element to the BLOWN state, the amplitude of the current used may be sufficient to create an open circuit between the electrodes.

It is noted that the programmable resistance element may be programmed into the BLOWN state from the low resistance state or from the high resistance state. Preferably, the programmable resistance element is programmed into the BLOWN state from the low resistance state. In addition, the programmable resistance element may be programmed into the BLOWN state from its virgin state prior to any device forming that might be done.

The currents needed to program the memory element into the BLOWN state can be achieved using a conventional power supply voltage source Vcc by bypassing the selection device 32 of the memory cell 20 shown in FIGS. 3 and 4.

Figure 7:
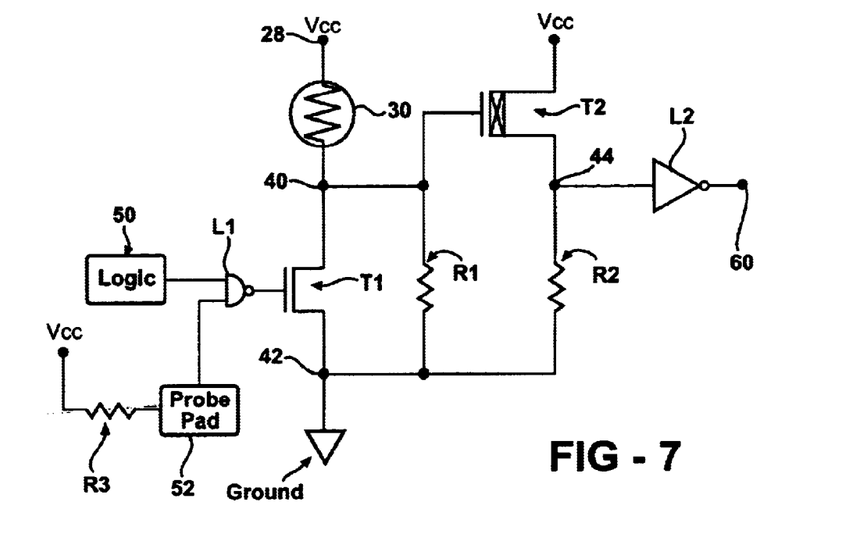
FIG. 7 shows a circuit for programming a programmable resistance element to the BLOWN state and reading the state of a programmable resistance element.

FIG. 7 is an embodiment of a circuit that may be used to program the programmable resistance element 30 to the BLOWN state as well as to read the programmable resistance element to determine whether or not it has been programmed to the BLOWN state. Referring to FIG. 7, it is seen that a logic circuit 50 and a probe pad 52 are inputs to a NAND gate L1. The output of NAND gate L1 is coupled to the gate of NMOS transistor T1. The source of transistor T1 is coupled to ground node 42. The drain of T1 is coupled to one terminal of the programmable resistance memory element 30 at node 40 (where node 40 is between the programmable resistance element 30 and the diode 32 shown in FIG. 3) so as to bypass the diode 32. The opposite terminal of the programmable resistance element 30 is coupled to the bitline node 28. The power supply voltage Vcc is supplied to the bitline node 28. Hence, the programmable resistance element 30 is coupled in series with the transistor T1 between Vcc and ground bypassing the selection device diode 32 shown in FIGS. 3 and 4. When the output of logic circuit 50 is low and the output of the probe pad 52 is high then the output of the NAND gate L1 will be high so that transistor T1 is turned on. This pulls current through the NMOS transistor T1 and the programmable resistance element 30. Transistor T1 is preferably sized for the power supply voltage Vcc to sink a current which is about 10 times the current used to reset the memory element. For example, for a 3.3V power supply (that is Vcc=3.3 volts), T1 may be sized so that its width W to length L ratio (W/L) is 100/2 or greater to, assure that adequate current is pulled through the transistor T1 to fuse open the memory device 30. After a reasonable time (such as about 100 nsec), T1 can be turned off by the logic circuit 50. Then the memory element 30 can be read by checking the voltage level at the output node 60, preferably after applying a set pulse to be sure the bit can no longer be programmed into the low resistance state. After T1 is turned off, if the voltage at node 60 is low, then the programmable resistance element 30 was successfully blown open. Otherwise, if the voltage at node 60 is high, then the programmable resistance element 30 was not successfully blown open and T1 may be turned on again for a longer period of time, say 1 usec. This can be repeated at ever greater programming times until the programmable resistance element 30 is successfully blown open. Alternately, it can be strobed in a clocked system to make it a dynamic current to reduce its power and current further for power sensitive applications.

Resistor R1 is preferably sized to be at least 50 times the initial "virgin" resistance of the programmable resistance element 30 when it comes out of fabrication. Preferably, the programmable resistance element 30 will be in the crystalline state when it comes out of fabrication and may have a resistance of about 1000 ohms. Hence, the resistance of R1 may be chosen to be about 50,000 ohms (or even greater to further reduce current).

The voltage across the programmable resistance element 30 is sensed by PMOS transistor T2. When the programmable resistance element 30 is in its low resistance state, most of the voltage drop between nodes 28 and 42 is across resistor R1 so that the voltage level at node 40 is approximately Vcc and the transistor T2 is off. With T2 in the off state, the voltage level at node 44 is low and the voltage level at the output node 60 is high.

When programmable resistance element 30 is in the BLOWN state, substantially all of the voltage drop between nodes 28 and 42 may be across the programmable resistance element 30 that the voltage at node 40 is low. This turns transistor T2 on. When T2 is turned on, the voltage at node 44 is pulled high and voltage at the output node 60 is pulled low. The resistor R2 preferably has a resistance which is close to that of R1. R1 and R2 can be made as current mirrors so only one long polysilicon resistor need be made on the chip.

The result of bypassing the memory isolation device (for example, the diode 32 shown in FIGS. 3 and 4) allows a sufficiently high current to be pulled through the programmable resistance memory element using only the memory chip power supply Vcc.

Alternately, a programmable resistance memory element may be blown open in a conventional memory array (for example, such as the array shown in FIG. 4) by providing oversize drivers on one or more of the columns and/or one or more of the rows of the array. An additional high current mirror option may be provided to allow programming into this BLOWN state, a state that is preserved despite further attempts to program and despite application of overly high temperatures to the chip. If done in the main array, the readout may include a conventional readout circuitry.

Programmable resistance memory elements may be used to customize an integrated circuit chip (also referred to as an integrated circuit die) in many ways to the benefit of the manufacturer and the customer. Manufacturing use of die customization using programmable resistance elements may include 1) die identification tagging to assist with process debugging and improvements through tracking as well as 2) die routing to particular product types and/or package types depending on process variables measured at earlier steps in the process. For example, a particular die having particular operating characteristics can be tagged so that it is routed to high performance, faster, and/or high power applications.

In addition, programmable resistance elements may be used for selecting product options by either the manufacturer or the customer. The manufacturer can select specific product options at the end of the manufacturing process as needed and dictated by customer demand. This gives much improved flexibility at the factory while giving rapid delivery times of customized products to customers. Customers may use die customization using programmable resistance memory elements to do field customization. Features can be designed into an integrated circuit that allow customers to select those features after purchase. Generic die can be sold to customers who select the features they want after purchase. Generic die can be sold to customers who select specific custom features at their board or system level. Thus the customer can stock and use inventory as their customer demand dictates. Customers may also adjust a specific die performance to their applications. For instance a generic die can be customized to emphasize low over high power performance or vice versa.

Programmable resistance elements may be used to store information and parameters about an integrated circuit. For example, operating parameters and characteristics (including even failure rates) for devices on an integrated circuit chip may be stored in programmable resistance elements. The programmable resistance elements may be located on the same chip as the devices. Integrated circuit devices include processors as well as semiconductor memories. Memories include nonvolatile memories as well as volatile memories (such as DRAM and SRAM). Using the programmable resistance elements, information including, but not limited to, the operating parameters, characteristics (such as speed) or failure rate of devices on the chip may be stored so that the information may be looked up quickly. In addition it is even possible that the microcode for a microcontroller may be stored in programmable resistance elements.

Hence, programmable resistance elements may be used for the customization of an integrated circuit to give it special characteristics. Programmable resistance elements may be used for identification purposes such as to store information about an integrated circuit or mark an integrated circuit in a manner that is readable not only visually (for example, with a bar code), but also electrically, for example by serialization of the integrated circuit. Programmable resistance elements may also be used to store information about how a device is configured. In addition, programmable resistance elements may be used to program programmable gate array devices.

Programmable resistance memory elements may be used for chip repair. For example, they may be used to convert partially defective die into fully functional die by routing addresses from defective rows and columns to redundant functional rows and columns. This can be done late in the process after packaging, after burn-in, or after high-speed sort in order to route around defective rows and columns as determined or brought out by these later steps.

The method of operating the programmable resistance element described herein allows for the programming of the element into a BLOWN state which may more permanently store information. Storage is more permanent since, after the programmable resistance element is blown open and placed into the BLOWN state, the element preferably remains in the BLOWN state even though additional energy (for example, thermal energy) or programming pulses may be applied to the elements.

Hence, using the BLOWN state allows for information (such as the die routing and die customization information, memory cell repair information, and even the microcode for the microcontroller) to be more permanently stored in a programmable resistance element by blowing it open and placing it in the BLOWN state. The present invention may thus be used as a way to more permanently personalize an integrated circuit chip (such as a nonvolatile memory chip or even a volatile memory chip) wherein information about the chip is stored in a programmable resistance element by placing the programmable resistance element into the BLOWN state. Placing the information in a programmable resistance element that has been programmed into the BLOWN state may ensure that the information will remain in the programmable resistance element even though additional energy (such a programming pulses or heat) enters the programmable resistance material. The programmable resistance elements placed in the BLOWN state may be used to more reliably store information including, but not limited to, identification information and even memory chip control timing.

Figure 8A:
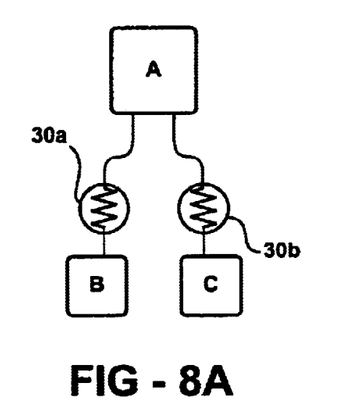
FIGS. 8A–8C shows circuit configurations using programmable resistance elements as connectivity elements.
Figure 8B:
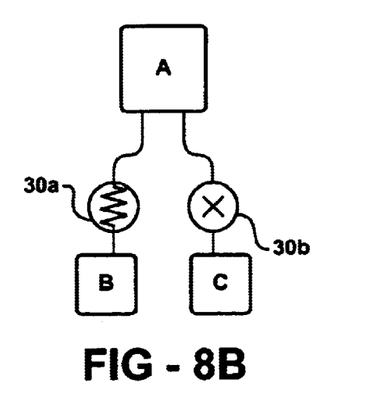
Figure 8C:
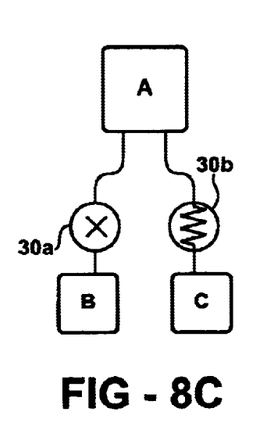

Using the operating method described herein, the programmable resistance elements may be used as a replacement for laser-blown fuses for many integrated circuit applications. In addition to the applications described above, the programmable resistance elements may be used to configure integrated circuits after manufacture by disconnecting pathways between various circuits and sub-circuits on an integrated circuit chip. As an example, FIG. 8A shows a block diagram of an integrated circuit that includes a main circuit A coupled to a sub-circuit B though a programmable resistance element 30a, and to a sub-circuit C through a programmable resistance element 30b. The circuit may be configured so that the main circuit A is coupled only to sub-circuit B by placing the programmable resistance element 30b into the BLOWN state as shown in FIG. 8B. Preferably, an open circuit is created between the main circuit A and the sub-circuit C. This type of configuration may be useful for a first circuit application. Alternately, the entire circuit may be configured so that the main circuit A is coupled only to the sub-circuit C by placing the programmable resistance element 30a into the BLOWN state. Preferably, an open circuit is created between the main circuit A and the sub-circuit B. This configuration may be useful for a second circuit application. This is shown in FIG. 8C.

Programmable resistance elements may also be used to replace laser blown fuses in applications pertaining to memory cell repair. Programmable resistance elements may be used to repair bad memory cells with redundant memory cells. Bad memory cells may be electrically disconnected from the memory cell array. Such electrical disconnection may be realized by disconnecting specific wiring lines by blowing open specific programmable resistance elements in the device as necessary.

An array of programmable resistance elements comprising two or more programmable resistance elements (for example, such as the array shown in FIG. 4) may be used to store information (such as the parameters and operating conditions of an integrated circuit chip). At least one of the programmable resistance elements may be programmed to a condition that cannot be transformed to the low resistance state of the programmable resistance element even though additional energy or programming pulses are applied to the element. That is, an array programmable resistance memory array may be programmed so that at least one of the programmable resistance elements is programmed to the BLOWN state.

As noted above, the programmable resistance memory material used in the programmable resistance elements of the present invention is preferably a phase-change material. Preferably, the programmable resistance material includes at least one chalcogen element. The chalcogen element may be chosen from the group consisting of Te, Se, and mixtures or alloys thereof. The programmable resistance material may further include at least one element selected from the group consisting of Ge, Sb, Bi, Pb, Sn, As, S, Si, P, O, and mixtures or alloys thereof. In one embodiment, the programmable resistance material comprises the elements Te, Ge and Sb. In another embodiment, the programmable resistance material consists essentially of Te, Ge and Sb. An example of a programmable resistance material which may be used is $Te_2Ge_2Sb_5$.

The programmable resistance material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified programmable resistance memory material is a phase-change material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified programmable resistance memory material is a phase-change material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof. Further examples of phase-change materials are described in U.S. Pat. Nos. 5,166,758, 5,296,716, 5,414, 271, 5,359,205, and 5,534,712, the disclosures of which are all hereby incorporated by reference herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of operating a programmable resistance element having at least a low resistance state and a high resistance state, said method comprising the steps of:

providing said programmable resistance element, said element including a programmable resistance material; and applying energy to said programmable resistance material sufficient to transform said programmable resistance element to a condition wherein application of additional energy is unable to transform said programmable resistance element to said low resistance state.

2. The method of claim 1, wherein the resistance of said programmable resistance element in said condition is at least twice the resistance of said programmable resistance element in said low resistance state.

3. The method of claim 1, wherein programmable resistance element further includes a first and second electrode in electrical communication with said programmable resistance material, and said condition includes an electrically open circuit between said first and second electrodes.

4. The method of claim 1, wherein said transformation to said condition includes a modification of said programmable resistance material.

5. The method of claim 1, wherein said energy is greater than the energy necessary for programming said memory element from the low resistance state to the high resistance state.

6. The method of claim 1, wherein said energy is at least five times greater than the energy necessary for programming said memory element from said low resistance state to said high resistance state.

7. The method of claim 1, wherein said energy is in the form of one or more pulses, each of said pulses having an amplitude corresponding to a power.

8. The method of claim 7, wherein said power is greater than the power needed to program said programmable resistance element from said low resistance state to said high resistance state.

9. The method of claim 7, wherein said power is at least five times greater than the power needed to program said programmable resistance element from said low resistance state to said high resistance state.

10. The method of claim 1, wherein said energy is an electrical signal.

11. The method of claim 10, wherein said electrical signal is an electrical current.

12. The method of claim 11, wherein said electrical current is greater than the current needed to program said memory element from said low resistance state to said high resistance state.

13. The method of claim 11, wherein said electrical current is five times greater than the current needed to program said memory element from said low resistance state to said high resistance state.

14. The method of claim 1, wherein said programmable resistance element is transformed to said condition from said low resistance state.

15. The method of claim 1, wherein said programmable resistance material is a phase-change material.

16. The method of claim 1, wherein said programmable resistance material includes a chalcogen element.

17. A method of customizing an integrated circuit, the integrated circuit including a first circuit coupled to a second circuit through a programmable resistance element having at least a low resistance state and a high resistance state, said element including a programmable resistance material, the method including the step of:

applying energy to said programmable resistance material sufficient to transform said programmable resistance element to a condition wherein application of additional energy is unable to transform said programmable resistance element to said low resistance state.

18. The method of claim 17, wherein the resistance of said programmable resistance element in said condition is at least twice the resistance of said programmable resistance element in said low resistance state.

19. The method of claim 17, wherein said condition provides an electrically open circuit between said first circuit and said second circuit.

20. The method of claim 17, wherein said energy is electrical energy.

21. The method of claim 20, wherein said electrical energy is an electrical current.

22. The method of claim 17, wherein said programmable resistance material comprises a phase-change material.

23. The method of claim 17, wherein said programmable resistance material comprises a chalcogen element.

24. An electrically programmable memory array, comprising: a plurality of programmable resistance elements having at least a low resistance state and a high resistance state, at least one of said elements being in a condition such that applying energy to said element in said condition is unable to transform said element in said condition to said low resistance state.

25. The memory array of claim 24, wherein the resistance of said element in said condition is at least twice the resistance of said low resistance state.

26. The memory array of claim 24, wherein said programmable resistance elements further includes a first and second electrode in electrical communication with said programmable resistance material, and said element in said condition having an electrically open circuit between the first and second electrodes of said element in said condition.

27. The memory array of claim 24, wherein said programmable resistance material is a phase-change material.

28. The memory array of claim 24, wherein said programmable resistance material includes a chalcogen element.

* * * * *